United States Patent
Lee et al.

(10) Patent No.: US 7,727,841 B2
(45) Date of Patent: Jun. 1, 2010

(54) METHOD OF MANUFACTURING SEMICONDUCTOR DEVICE WITH DUAL GATES

(75) Inventors: Hye-Lan Lee, Hwaseong-si (KR); Hag-Ju Cho, Seoul (KR); Taek-Soo Jeon, Yongin-si (KR); Yu-Gyun Shin, Seongnam-si (KR); Sang-Bom Kang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 740 days.

(21) Appl. No.: 11/497,998

(22) Filed: Aug. 1, 2006

(65) Prior Publication Data

US 2007/0111453 A1    May 17, 2007

(30) Foreign Application Priority Data

Aug. 2, 2005    (KR) ...................... 10-2005-0070501

(51) Int. Cl.
*H01L 21/8238* (2006.01)

(52) U.S. Cl. ................ 438/275; 257/392; 257/E21.637

(58) Field of Classification Search ................. 438/275; 257/392, E21.637
See application file for complete search history.

(56) References Cited

U.S. PATENT DOCUMENTS

| | | | |
|---|---|---|---|
| 6,518,106 B2 | 2/2003 | Ngai et al. ................... | 438/157 |
| 6,727,130 B2 * | 4/2004 | Kim et al. .................... | 438/199 |
| 6,894,353 B2 | 5/2005 | Samavedam et al. | |
| 7,056,776 B2 | 6/2006 | Park et al. | |
| 2004/0023478 A1 * | 2/2004 | Samavedam et al. ........ | 438/592 |
| 2004/0191974 A1 * | 9/2004 | Gilmer et al. ............... | 438/199 |
| 2005/0048722 A1 * | 3/2005 | Saito et al. .................. | 438/275 |
| 2005/0258468 A1 * | 11/2005 | Colombo et al. ............ | 257/314 |

FOREIGN PATENT DOCUMENTS

| | | |
|---|---|---|
| KR | 10-0351251 | 8/2002 |
| KR | 10-2003-0002256 | 1/2003 |
| KR | 10-2005-0028509 | 3/2005 |

OTHER PUBLICATIONS

Samavedam et al., "Dual-Metal Gate CMOS with HfO2 Gate Dielectric", 2002, IEDM Technical Digest, pp. 433-436.*

* cited by examiner

*Primary Examiner*—Steven J Fulk
(74) *Attorney, Agent, or Firm*—Mills & Onello, LLP (57) ABSTRACT

In a semiconductor device with dual gates and a method of manufacturing the same, a dielectric layer and first and second metallic conductive layers are successively formed on the semiconductor substrate having first and second regions. The second metallic conductive layer which is formed on the first metallic conductive layer of the second region is etched to form a metal pattern. The first metallic conductive layer is etched using the metal pattern as an etching mask. A polysilicon layer is formed on the dielectric layer and the metal pattern. The first gate electrode is formed by etching portions of the polysilicon layer, the metal pattern, and the first metallic conductive layer of the first region. The second gate electrode is formed by etching a portion of the polysilicon layer formed directly on the dielectric layer of the second region.

15 Claims, 6 Drawing Sheets

METHOD OF MANUFACTURING SEMICONDUCTOR DEVICE WITH DUAL GATES

CROSS-REFERENCE TO RELATED APPLICATIONS

This application claims priority under 35 U.S.C. §119 to Korean Patent Application No. 2005-70501 filed on Aug. 2, 2005, the contents of which are herein incorporated by reference in their entirety.

BACKGROUND OF THE INVENTION

1. Field of the Invention

The present invention relates to a semiconductor device and a method of manufacturing the same. More particularly, the present invention relates to a complementary metal oxide semiconductor (CMOS) device with dual gates and a method of manufacturing the same.

2. Description of the Related Art

Metal Oxide Semiconductor (MOS) transistors can generally be classified into N-channel Metal Oxide Semiconductor (NMOS) transistors and P-channel Metal Oxide Semiconductor (PMOS) transistors depending on a channel type. A CMOS transistor includes all characteristics of NMOS and PMOS since a CMOS transistor consists of an NMOS transistor and a PMOS transistor in a singular semiconductor device.

Polysilicon has been traditionally used as a gate electrode material for MOS-based transistors. The polysilicon gate electrode is typically doped with either $P^+$ or $N^+$ to match the doped source/drain regions in CMOS technology. However, as the size of semiconductor device continues to decrease, polysilicon becomes less effective as a material to be used as a gate electrode.

The polysilicon gate is highly doped so as to be nearly as conductive as metal, while the solubility (or concentration) of dopants in the polysilicon gate is limited to around $5\times10^{20}$ atoms/cm$^3$. Since the solubility of dopants restricts the number of charge carriers in the polysilicon gate, a depletion layer is formed at the interface between the polysilicon gate and a gate dielectric layer when the gate is biased. The depletion region in the polysilicon gate acts as an additional capacitance in series with the gate dielectric capacitance. In other words, the depletion region increases the equivalent oxide thickness (EOT) of the transistor by at least 4 to 6 Å, thereby decreasing the driving current of the transistor.

Meanwhile, the efficacy of a silicon oxide film or a silicon oxynitride film conventionally used as the gate dielectric layer has reached its limit because of the rapid decrease in size of semiconductor devices, and difficulties in securing the reliability of the gate dielectric layer. For example, if the silicon oxide film becomes thinner than 20 Å, the gate leakage current is increased by quantum-mechanical direct tunneling through the silicon oxide film, and the power consumption increases. Accordingly, there are limitations to the amount of reduction in the thickness of the gate dielectric layer formed of silicon oxide or silicon oxynitride.

To overcome this problem, research with regard to the use of alternative gate dielectrics with dielectric constants (k) higher than silicon oxide or silicon oxynitride is being actively conducted. Dielectrics having dielectric constants (k) higher than silicon oxide or silicon oxynitride are referred to as high-k dielectrics. When the high-k dielectrics are used as the gate dielectric layer, the physical thickness of the gate dielectric layer can be large while the EOT can be scaled down for compatibility with the other reduced feature sizes, and the leakage current generated between the gate electrode and a channel region can be decreased.

However, in MOS transistors utilizing high-k gate dielectrics and polysilicon gate electrodes, defect states and numerous bulk traps, which are generated at the interface between a semiconductor substrate and a gate dielectric layer, capture electrons contributing conduction so that a Fermi level is pinned on a charge neutrality level or a central portion of an energy band located around the charge neutrality level, thereby largely increasing the threshold voltage (Vth) of the transistor.

The polysilicon gate depletion effect and the Fermi level pinning phenomenon occur more seriously in the case of PMOS transistors. Particularly, in the PMOS transistors, boron penetrates from the polysilicon gate electrode doped with p+through the gate dielectric layer to the channel region of the semiconductor substrate, thereby varying the flatband voltage (Vfb) and threshold voltage (Vth), and deteriorating the device reliability.

The above-described problems may be solved forming a gate electrode having a similar work function as the one of either P or N doped polysilicon. The N doped polysilicon has a work function of approximately 4.2 eV whereas the P doped polysilicon has a work function of approximately 5.1 eV. The difficulty is to choose a material which is suitable to both these work function values.

Another option is to form a gate electrode using two different materials with one that is similar to the work function of the N-doped polysilicon, and the other that is similar to the work function of the P-doped polysilicon.

Figure 1:
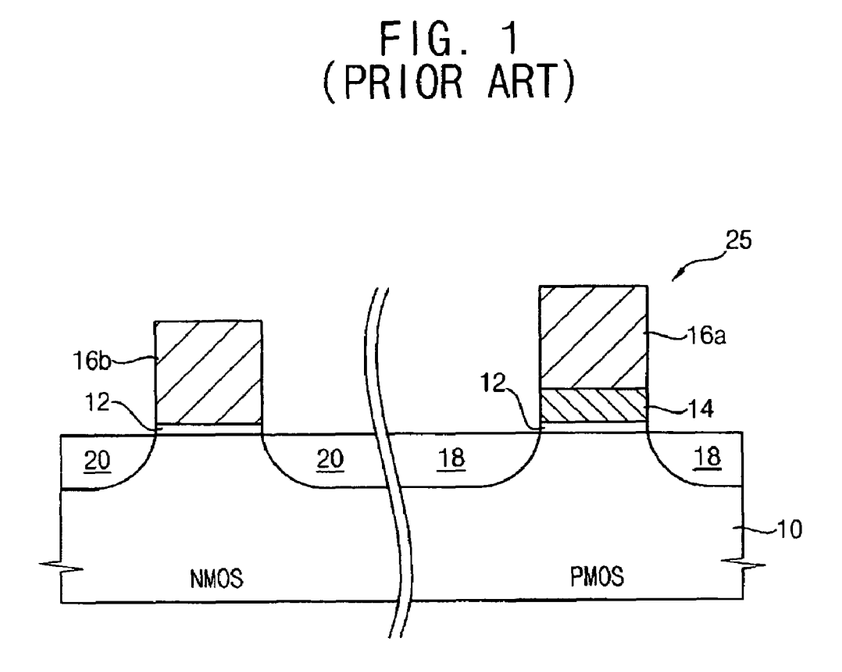
FIG. 1 is a cross-sectional view illustrating a semiconductor device with dual gates according to a conventional method.

FIG. 1 is a cross-sectional view illustrating a semiconductor device with dual gate electrodes according to a conventional method.

Referring to FIG. 1, a gate dielectric layer 12 including a high-k dielectric such as $HfO_2$ is formed on a semiconductor substrate 10 having PMOS and NMOS transistor regions.

A metal containing material such as tantalum nitride (TaN), which has a work function suitable to a PMOS transistor, is deposited on the gate dielectric layer 12 to form a metal gate layer. Then, the metal gate layer is wet-etched to leave a portion of the metal gate layer only on the PMOS transistor region.

After depositing a doped polysilicon layer on the gate dielectric layer 12 and the remaining portion of the metal gate layer, the polysilicon layer and the remaining portion of the metal gate layer are patterned by a lithography process. As a result, a gate stack 25 including a metal gate 14 and a polysilicon gate 16a is formed on the PMOS transistor region, while a polysilicon gate 16b is formed on the NMOS transistor region.

Here, a reference numeral 18 indicates source/drain regions of PMOS transistor and a reference numeral 20 indicates source/drain regions of NMOS transistor.

In the conventional method described above, it is difficult to etch the metal gate layer. The unnecessary portion of the metal gate layer is removed by a wet etching process in order to prevent the underlying gate dielectric layer from being damaged. In case that the metal gate layer is etched using a photoresist layer as an etching mask, the photoresist layer cannot effectively serve as the etching mask because the photoresist layer is removed by a wet etchant.

In the case where the metal gate layer is etched using a hard mask layer of silicon oxide, the underlying gate dielectric layer is removed together during a wet etching process of removing the hard mask layer.

In the case where the metal gate layer is etched using a hard mask layer of polysilicon, it is unnecessary to remove the polysilicon hard mask layer, thereby simplifying the process. However, since the polysilicon hard mask layer needs to be formed thicker than 300 Å due to the limitation of the process uniformity, a difference in height between the NMOS transistor region and the PMOS transistor region becomes larger, and thus the etching process for gate patterning becomes difficult.

SUMMARY OF THE INVENTION

Example embodiments of the present invention provide a semiconductor device with dual gates for simplifying processes and decreasing the height difference between an NMOS transistor region and a PMOS transistor region.

Example embodiments of the present invention also provide a method of manufacturing a semiconductor device with dual gates for simplifying processes and decreasing the height difference between an NMOS transistor region and a PMOS transistor region.

In one aspect, the present invention is directed to a semiconductor device with dual gates, comprising: a semiconductor substrate having a first region on which a MOS transistor of a first conductivity type will be formed and a second region on which a MOS transistor of a second conductivity type will be formed, a first gate dielectric layer on the semiconductor substrate of the first region, a first gate electrode on the first gate dielectric layer, the first gate electrode including a lower metallic conductive pattern, an upper metallic conductive pattern, and a first polysilicon layer pattern, which are successively deposited, a second gate dielectric layer on the semiconductor substrate of the second region, a second gate electrode on the second gate dielectric layer, the second gate electrode including a second polysilicon layer pattern. The lower metallic conductive pattern determines a work function of the first gate electrode.

In one embodiment, the lower metallic conductive pattern comprises a metal containing conductive material having a work function suitable to the MOS transistor of the first conductivity type.

In another embodiment, the lower metallic conductive pattern comprises any material selected from the group consisting of WN, TaN, TiN, Ni, Pd, Pt, Be, Ir, Te, Re, Ru and Rh.

In another embodiment, the upper metallic conductive pattern comprises a metal containing conductive material having an etch selectivity with respect to the lower metallic conductive pattern.

In another embodiment, the upper metallic conductive pattern comprises any material selected from the group consisting of TaN, WN, HfN, ZrN, TaSiN, TiSiN, NiSiN, Pd, Pt, Be, Ir, Te, Re, Ru, Rh, Al, Ag, Bi, Cd, Fe, Ta, Ga, Hf, In, Mn, Nb, Y and Zr.

In another embodiment, the upper metallic conductive pattern has a thickness of less than about 100 Å.

In another embodiment, the first and second gate dielectric layers comprise a high-k dielectric.

In another embodiment, the first conductivity type is P-type and the second conductivity type is N-type.

In another aspect, the present invention is directed to a semiconductor device with dual gates, comprising: a semiconductor substrate having a first region on which a MOS transistor of a first conductivity type will be formed and a second region on which a MOS transistor of a second conductivity type will be formed, a gate dielectric layer on the semiconductor substrate in the first and second regions, a first gate electrode on the gate dielectric layer of the first region, the first gate electrode including a lower metallic conductive pattern, an upper metallic conductive pattern, and a first polysilicon layer pattern, which are successively deposited, a second gate electrode on the gate dielectric layer of the second region, the second gate electrode including a second polysilicon layer pattern. The lower metallic conductive pattern comprises WN, and the upper metallic conductive pattern comprises TaN.

In another aspect, the present invention is directed to a method of manufacturing a semiconductor device with dual gates, comprising: providing a semiconductor substrate having a first region on which a MOS transistor of a first conductivity type will be formed and a second region on which a MOS transistor of a second conductivity type will be formed, forming a dielectric layer, a first metallic conductive layer and a second metallic conductive layer on the first and second regions, etching the second metallic conductive layer formed on the first metallic conductive layer of the second region, thereby a metal pattern is formed on the first metallic conductive layer of the first region, etching the first metallic conductive layer formed on the dielectric layer of second region using the metal pattern as an etching mask, forming a polysilicon layer on the dielectric layer of the second region and the metal pattern of the first region, forming a first gate electrode by etching portions of the polysilicon layer, the metal pattern, and the first metallic conductive layer of the first region, the first gate electrode including a lower metallic conductive pattern, an upper metallic conductive pattern, and a polysilicon pattern, and forming a second gate electrode by etching a portion of the polysilicon layer formed directly on the dielectric layer of the second region.

In one embodiment, the first metallic conductive layer comprises a metal containing conductive material having a work function suitable to the MOS transistor of the first conductivity type.

In another embodiment, the first metallic conductive layer comprises any material selected from the group consisting of WN, TaN, TiN, Ni, Pd, Pt, Be, Ir, Te, Re, Ru and Rh.

In another embodiment, the second metallic conductive layer comprises a metal containing conductive material having an etch selectivity with respect to the first metallic conductive layer.

In another embodiment, the second metallic conductive layer comprises any material selected from the group consisting of TaN, WN, HfN, ZrN, TaSiN, TiSiN, NiSiN, Pd, Pt, Be, Ir, Te, Re, Ru, Rh, Al, Ag, Bi, Cd, Fe, Ta, Ga, Hf, In, Mn, Nb, Y and Zr.

In another embodiment, the second metallic conductive layer has a thickness of less than about 100 Å.

In another embodiment, etching the second metallic conductive layer formed on the first metallic conductive layer of the second region comprises: forming a photoresist layer pattern on the second metallic conductive layer of the first region, removing the second metallic conductive layer of the second region using the photoresist layer pattern as an etching mask, and removing the photoresist layer pattern.

In another embodiment, etching the second metallic conductive layer formed on the first metallic conductive layer of the second region comprises: forming a hard mask layer on the second metallic conductive layer, patterning the hard mask layer using a photoresist pattern as an etching mask to form a hard mask layer pattern on the second metallic conductive layer of the first region, removing the photoresist pattern, etching the second metallic conductive layer of the second region using the hard mask layer pattern as an etching mask, and removing the hard mask layer pattern.

In another embodiment, etching the first metallic conductive layer formed on the dielectric layer of second region using the metal pattern as an etching mask is performed by a wet etching process.

In another embodiment, the dielectric layer comprises a high-k dielectric.

In another embodiment, the method, prior to forming the polysilicon layer, further comprising performing a heat treatment process for curing a damage of the dielectric layer caused by etching the first metallic conductive layer of the second region.

In another embodiment, the heat treatment process is performed under an atmosphere including any one selected from the group consisting of $N_2$, NO, $N_2O$, $O_2$, $NH_3$ and $H_2$ or a combination thereof.

In another embodiment, the first conductivity type is P-type and the second conductivity type is N-type.

BRIEF DESCRIPTION OF THE DRAWINGS

The above and other features and advantages of the present invention will become readily apparent by reference to the following detailed description when considering in conjunction with the accompanying drawings, in which.

DETAILED DESCRIPTION OF EMBODIMENTS OF THE INVENTION

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiment 1

Figure 2:
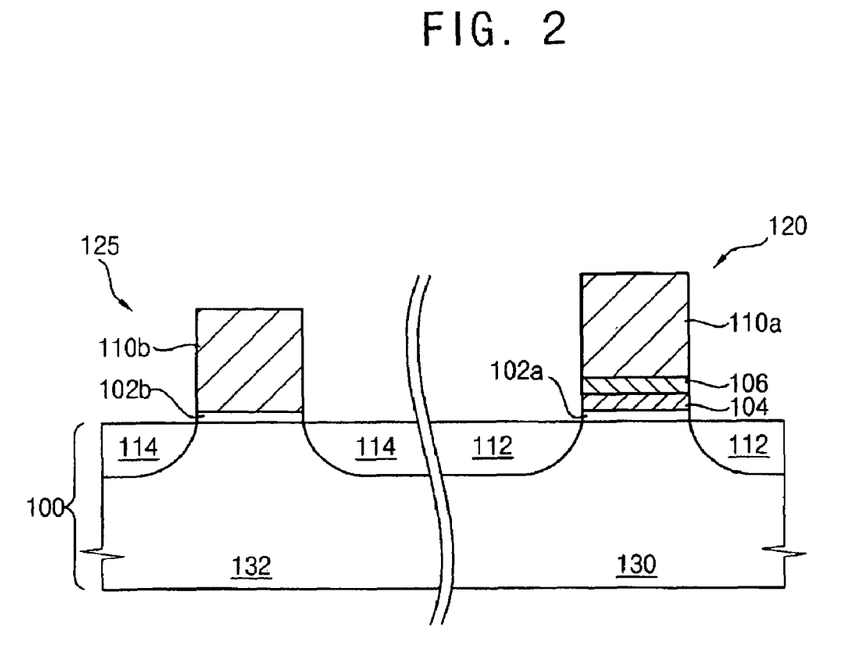
FIG. 2 is a cross-sectional view illustrating a semiconductor device with dual gates according to a first example embodiment of the present invention.

FIG. 2 is a cross-sectional view illustrating a semiconductor device with dual gates according to a first example embodiment of the present invention.

Referring to FIG. 2, a semiconductor device according to an example embodiment of the present invention includes a semiconductor substrate 100 having a first region 130 and a second region 132. A MOS transistor of a first conductivity type is formed on the first region 130 and a MOS transistor of a second conductivity type opposite to the first conductivity type is formed on the second region 132.

The first conductivity type may be P-type and the second conductivity type may be N-type.

A PMOS transistor including a first gate dielectric layer 102a, a first gate electrode 120 and first source/drain regions 112 is formed on the first region 130 of the semiconductor substrate 100, while an NMOS transistor including a second gate dielectric layer 102b, a second gate electrode 125 and second source/drain regions 114 is formed on the second region 132 of the semiconductor substrate 100.

The first gate electrode 120 of the PMOS transistor is formed of a stacked structure including a lower metallic conductive pattern 104, an upper metallic conductive pattern 106 and a first polysilicon layer pattern 110a, while the second gate electrode 125 of the NMOS transistor is formed of a single layer structure including a second polysilicon layer pattern 110b, thereby realizing a CMOS device with dual gate electrodes having two different work functions where one would be suitable to the PMOS transistor and the other suitable to the PMOS transistor.

Alternatively, a metal/polysilicon gate stack may be formed on the NMOS transistor region and a polysilicon gate electrode may be formed on the PMOS transistor region. However, it is preferred that the metal/polysilicon gate stack is formed on the PMOS transistor region and the polysilicon gate electrode is formed on the NMOS transistor region, because the Fermi level pinning phenomenon and the polysilicon depletion effect occur more seriously in the PMOS transistor as compared with the NMOS transistor and besides, the boron penetration also occurs in the PMOS transistor.

The conduction band for silicon lies at 4.1 eV below the vacuum level. The valence band lies at approximately 1.1 eV below the conduction band for silicon or at 5.2 eV below the vacuum level. The approximately 1.1 eV difference between the valence and conduction bands for silicon is referred to as the band-gap. The mid-gap is approximately half of the band-gap and is located approximately halfway between the conduction and valence bands of the material.

A desirable work function for a gate electrode of an NMOS transistor is one which falls between the conduction band and mid-gap of the semiconductor substrate and more preferably, is located between approximately 4.0 eV and 4.4 eV. On the contrary, a desirable work function for a gate electrode of a PMOS transistor is one which falls between the valence band and the mid-gap of the semiconductor substrate and more preferably, is between approximately 4.8 eV and 5.2 eV.

The lower metallic conductive pattern 104 is a layer that determines the work function of the first gate electrode 120 and may be formed from a metal-containing conductive material having the work function suitable to the PMOS transistor, e.g., the work function of more than about 4.6 eV. In other words, the work function of the lower metallic conductive pattern 104, together with the doping level of the substrate 100, determines the threshold voltage of the PMOS transistor.

The lower metallic conductive pattern 104 may be formed from tungsten nitride (WN). Alternatively, the lower metallic conductive pattern 104 may be formed from tantalum nitride (TaN), titanium nitride (TiN), nickel (Ni), palladium (Pd), platinum (Pt), beryllium (Be), Iridium (Ir), tellurium (Te), rhenium (Re), Ruthenium (Ru), rhodium (Rh), or the like.

The upper metallic conductive pattern 106 may serve as an etching mask for the lower metallic conductive pattern 104 and may be formed from a metal-containing conductive material which does not adversely affect, or which can increase, the work function of the lower metallic conductive pattern 104.

The upper metallic conductive pattern 106 may be formed from tantalum nitride (TaN). Alternatively, the upper metallic conductive pattern 106 may be formed from tungsten nitride (WN), hafnium nitride (HfN), Zirconium nitride (ZrN), tantalum silicon nitride (TaSiN), titanium silicon nitride (TiSiN), nickel silicon nitride (NiSiN), palladium (Pd), platinum (Pt), beryllium (Be), Iridium (Ir), tellurium (Te), rhenium (Re), Ruthenium (Ru), rhodium (Rh), aluminum (Al), argentum (Ag), bismuth (Bi), cadmium (Cd), ferrum (Fe), tantalum (Ta), gallium (Ga), hafnium (Hf), indium (In), manganese (Mn), niobium (Nb), yttrium (Y), zirconium (Zr), or the like.

In the conventional method, tantalum nitride (TaN) having a work function of approximately 4.8 eV and excellent thermal stability was primarily used as a metal-containing conductive material for the metal/polysilicon gate stack of the PMOS transistor. However, the tantalum nitride material is hardly removed during an etching process because of the low etch rate of tantalum nitride (TaN) with respect to a wet solution.

Accordingly, in some embodiments of the present invention, the lower metallic conductive pattern 104 determining the work function of the first gate electrode 120 for the PMOS transistor is formed from tungsten nitride (WN) having a work function similar to that of the tantalum nitride (TaN) and exhibiting a high etch rate to the wet solution. The upper metallic conductive pattern 106 serving as an etching mask of the lower metallic conductive pattern 104 is formed from tantalum nitride (TaN) having a high wet etch selectivity with respect to the tungsten nitride (WN).

Figure 3A:
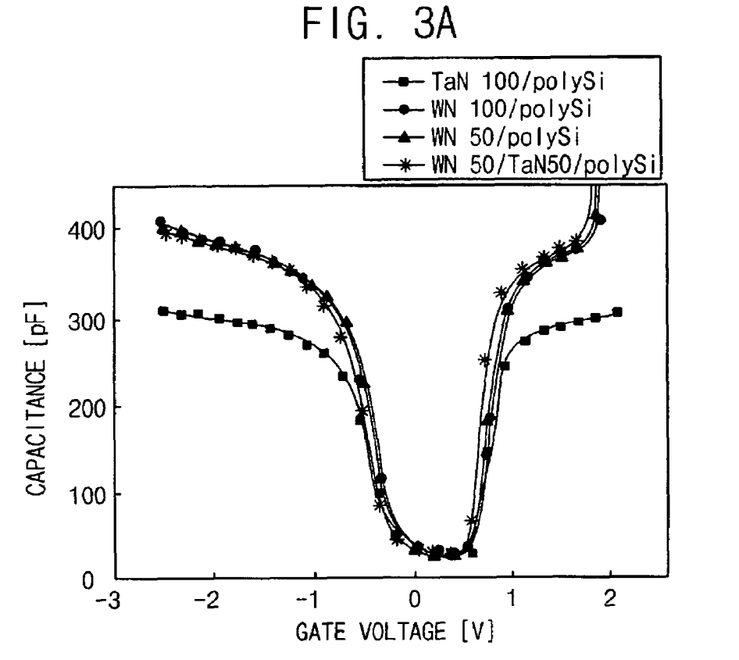
FIGS. 3A and 3B are graphs illustrating electrical characteristics of a gate electrode having a tungsten nitride layer.
Figure 3B:
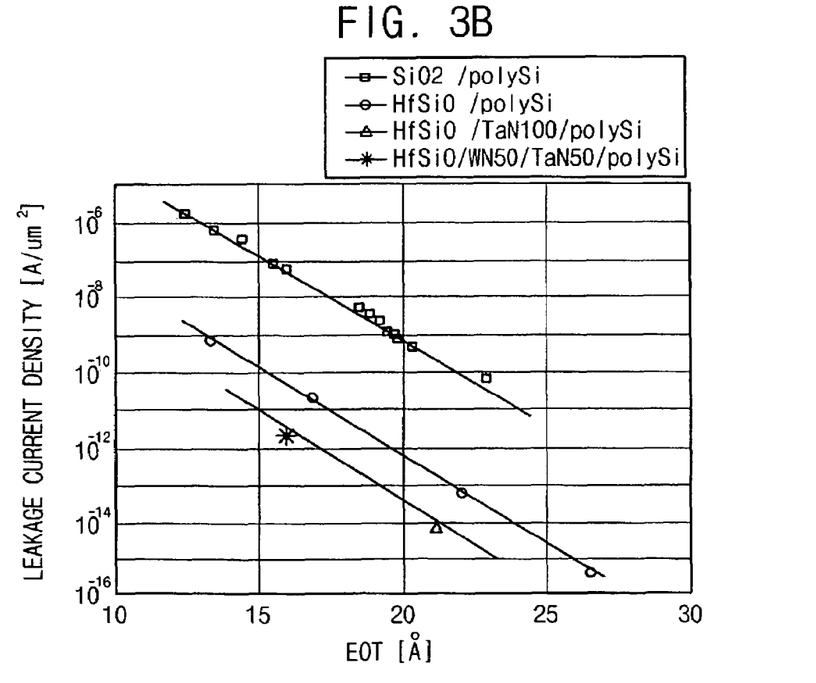

FIGS. 3A and 3B are graphs illustrating electrical characteristics of a gate electrode having a tungsten nitride layer.

FIG. 3A is a graph illustrating a variation of capacitance (C) with respect to a gate voltage (Vg). In this graph, the longitudinal axis represents a gate voltage [V] and the vertical axis represents a capacitance [pF]. The graph showing the relation between the capacitor and the voltage is referred to as C-V curve. In FIG. 3A, a symbol ■ indicates a C-V curve of a gate stack including a tantalum nitride layer having a thickness of about 100 Å and a polysilicon layer. A symbol ● indicates a C-V curve of a gate stack including a tungsten nitride layer having a thickness of about 100 Å and a polysilicon layer. A symbol ▲ indicates a C-V curve of a gate stack including a tungsten nitride layer having a thickness of about 50 Å and a polysilicon layer. A symbol * indicates a C-V curve of a gate stack including a tungsten nitride layer having a thickness of about 50 Å, a tantalum nitride layer having a thickness of about 50 Å and a polysilicon layer.

Referring to FIG. 3A, a flatband voltage (Vfb) of the tungsten nitride/polysilicon gate stack is almost identical to that of the tantalum nitride/polysilicon gate stack, because the tungsten nitride layer has a work function similar to that of the tantalum nitride layer (see the part shown in a dotted line).

Further, the tungsten nitride/polysilicon gate stack has the same C-V curve regardless of the thickness of the tungsten nitride layer.

Moreover, the C-V curve of the gate stack in which the tantalum nitride layer serving as an etching mask remains on the tungsten nitride layer determining the work function of the gate electrode for the PMOS transistor is similar to the C-V curve of the gate stack having a single tungsten nitride layer.

FIG. 3B is a graph illustrating a leakage current density (Jg) with respect to an equivalent oxide thickness (EOT). In this graph, the horizontal axis represents an EOT [Å] and the vertical axis represents a leakage current density [Å/$\mu m^2$]. In FIG. 3B, a symbol □ indicates a case that a polysilicon gate electrode is formed on a gate dielectric layer of silicon oxide ($SiO_2$). A symbol ○ indicates a case that a polysilicon gate electrode is formed on a gate dielectric layer of HfSiO. A symbol Δ indicates a case that a gate stack including a tantalum nitride layer about 100 Å thick and a polysilicon layer is formed on a gate dielectric layer of HfSiO. A symbol * indicates a case that a gate stack including a tungsten nitride layer about 50 Å thick, a tantalum nitride layer about 50 Å thick and a polysilicon layer is formed on a gate dielectric layer of HfSiO.

Referring to FIG. 3B, the gate stack of the example embodiment of the present invention, which includes the tungsten nitride layer, the tantalum nitride layer and the polysilicon layer, exhibits excellent features in the aspect of EOT-Jg characteristics as compared with the single polysilicon gate electrode and has almost the identical property to that of the gate stack including the tantalum nitride layer and the polysilicon layer.

As described above, the upper metallic conductive pattern 106 serving as an etching mask of the lower metallic conductive pattern 104 is formed of a material which does not adversely affect, or can increase, the work function of the lower metallic conductive pattern 104. As a result, the gate stack having a metallic gate of dual structure including the lower metallic conductive pattern 104 and the upper metallic conductive pattern 106 exhibits electrical characteristics similar to those of the gate stack having a metallic gate of single layer including the lower metallic conductive pattern or a metal containing material having the work function similar to that of the lower metallic conductive pattern.

Accordingly, the dual gate electrodes in accordance with the example embodiment of the present invention have the advantage of process simplification, because the upper metallic conductive pattern 106 serving as an etching mask of the lower metallic conductive pattern 104 is used as a component of the gate stack without being removed.

Further, since the upper metallic conductive pattern 106 has a high etch selectivity with respect to the lower metallic conductive pattern 104, the upper metallic conductive pattern 106 can serve as a suitable etching mask even though it is formed relatively thinly, for example to a thickness of less than about 100 Å, thereby decreasing the height difference of the gate electrodes between the NMOS transistor region and the PMOS transistor region.

Embodiment 2

FIGS. 4A to 4D are cross-sectional views illustrating a method of manufacturing a semiconductor device in accordance with a second example embodiment of the present invention.

Figure 4A:
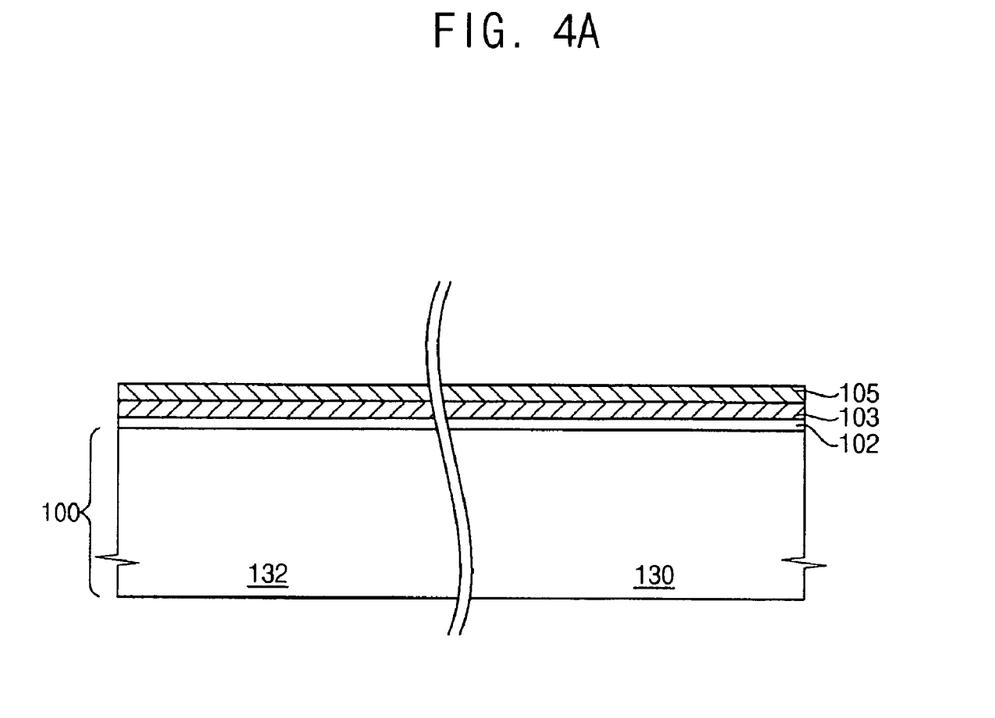
FIGS. 4A to 4D are cross-sectional views illustrating a method of manufacturing a semiconductor device with dual gates according to a second example embodiment of the present invention.

Referring to FIG. 4A, a first region 130 and a second region 132 are defined in a semiconductor substrate 100, a MOS transistor of a first conductivity type is formed on the first region 130, and a MOS transistor of a second conductivity type opposite to the first conductivity type is formed on the second region 132.

Here, the first conductivity type may be P-type and the second conductivity type may be N-type.

Specifically, the first region 130 is an N-well on which a PMOS transistor will be formed, while the second region 132 is a P-well on which an NMOS transistor will be formed. One of skills in the art will recognize that the location of the PMOS transistor region and the NMOS transistor region can be reversed.

Then, a high-k dielectric material is deposited to a thickness of less than about 50 Å on the semiconductor substrate 100, thereby forming a dielectric layer 102 serving as a gate dielectric layer. The high-k dielectric material preferably has a dielectric constant greater than 5. More preferably, the high-k dielectric material has a dielectric constant greater than about 10. Such "high-k" materials include oxides of Group 4 and Group 5 metals (e.g., Ti, Zr, Hf, V, Nb, Ta), as well as more complex oxides. The High-k dielectric materials can also include lanthanide oxides such as lanthanum oxide (k≈21), neodymium oxide (k≈16) and cerium oxide (k≈15). In other arrangements, it will be understood that the high-k dielectric material can include multiple materials, either as a ternary structure or a laminate of multiple high-k dielectric material layers.

Thus, the dielectric layer 102 may be formed of any materials known in the art, such as hafnium oxide ($HfO_2$), zirconium oxide ($ZrO_2$), titanium oxide ($TiO_2$), tantalum oxide ($Ta_2O_5$), niobium oxide ($Nb_2O_3$), aluminum oxide ($Al_2O_3$), cerium oxide ($Ce_2O_3$), lanthanum oxide ($La_2O_3$), praseodymium oxide ($Pr_2O_3$), dysprosium oxide ($Dy_2O_3$), erbium oxide ($Er_2O_3$), yttrium oxide ($Y_2O_3$), barium strontium titanate (BST), strontium titanate (ST), barium titanate (BT), lead zirconium titanate (PZT), strontium bismuth tantalate (SBT), and the like. The dielectric layer 102 may be formed of multiple materials, for example as a ternary structure or a laminate of multiple layers, including $ZrSiO_4$, ZrSiON, HfSiON, HfAlO, HfAlON, AlSiO, AlSiON, $BaSiO_4$, $PbSiO_4$, or the like.

The dielectric layer 102 may be formed by any suitable methods known in the art, such as chemical vapor deposition (CVD), plasma-enhanced chemical vapor deposition (PECVD), high density plasma-chemical vapor deposition (HDP-CVD) and atomic layer deposition (ALD). In the presently described method embodiment, the dielectric layer 102 is formed by ALD.

Then, a metal containing conductive material having a work function suitable to the PMOS transistor is deposited to a thickness of less than about 100 Å on the dielectric layer 102, thereby forming a first metallic conductive layer 103.

The first metallic conductive layer 103 preferably may be formed from a conductive materials such as WN, TaN, TiN, Ni, Pd, Pt, Be, Ir, Te, Re, Ru, Rh, and the like, more preferably from tungsten nitride (WN).

The first metallic conductive layer 103 may be deposited by any method known in the art. For the example, and without limitation, the first metallic conductive layer 103 may be deposited by chemical vapor deposition (CVD), physical vapor deposition (PVD), atomic layer deposition (ALD), electrochemical deposition (ECD), metal organic CVD (MOCVD), plasma-enhanced CVD (PECVD) or plasma-enhanced ALD (PEALD). In this embodiment, the first metallic conductive layer 103 is formed to a thickness of about 50 Å by the CVD.

Then, a metal containing conductive material having an etch selectivity with respect to the material constituting the first metallic conductive layer 103 is deposited to a thickness of less than about 100 Å on the first metallic conductive layer 103, thereby forming a second metallic conductive layer 105. Further, the material constituting the second metallic conductive layer 105 does not adversely affect, or can increase, the work function of the first metallic conductive layer 103.

The second metallic conductive layer 105 may be formed from a conductive materials such as TaN, WN, HfN, ZrN, TaSiN, TiSiN, NiSiN, Pb, Pt, Be, Ir, Te, Re, Ru, Rh, Al, Ag, Bi, Cd, Fe, Ta, Ga, Hf, In, Mn, Nb, Y, Zr, and the like, more preferably from tantalum nitride (TaN).

The second metallic conductive layer 105 may be deposited by any method known in the art. For the example, and without limitation, the second metallic conductive layer 105 may be deposited by CVD, PVD, ALD, ECD, MOCVD, PECVD or PEALD. In this method embodiment, the second metallic conductive layer 105 is formed to a thickness of about 50 Å by the PVD.

Figure 4B:
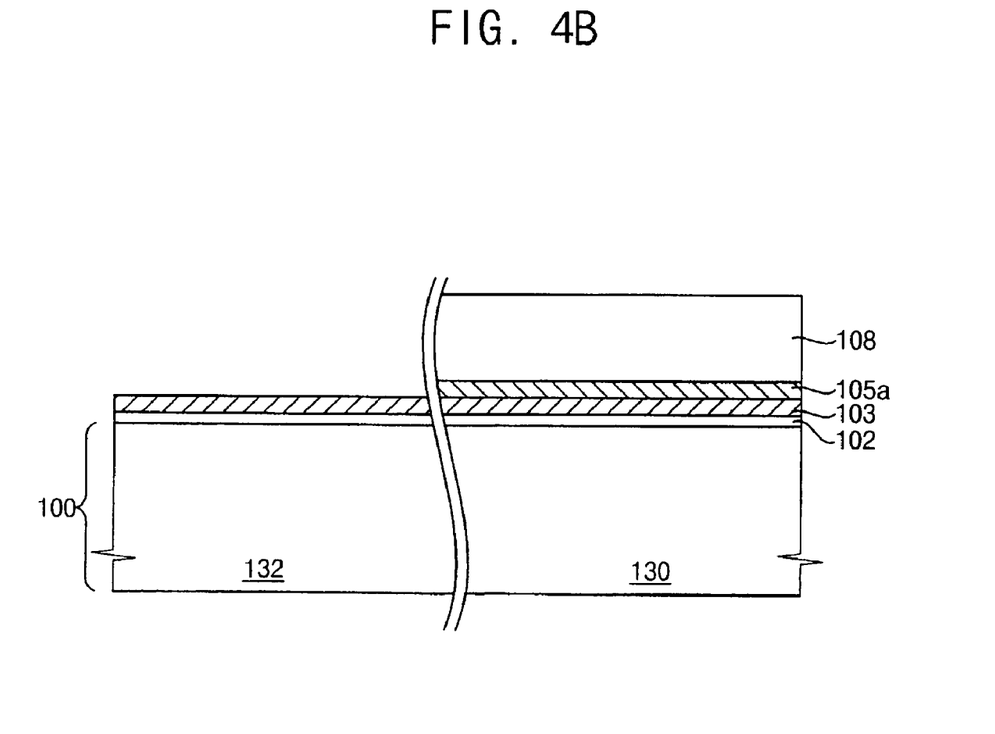

Referring to FIG. 4B, after coating a photoresist layer on the second metallic conductive layer 105, the photoresist layer is exposed and developed to form a photoresist layer pattern 108 opening the second region 132 on which the NMOS transistor will be formed.

Then, using the photoresist layer pattern 108 as an etching mask, the exposed second metallic conductive layer 105 is etched by a dry etching process with fluorine-based etching gas, thereby leaving a second metallic conductive layer portion 105a on the first metallic conductive layer 103 of the first region 130 on which the PMOS transistor will be formed.

Figure 4C:
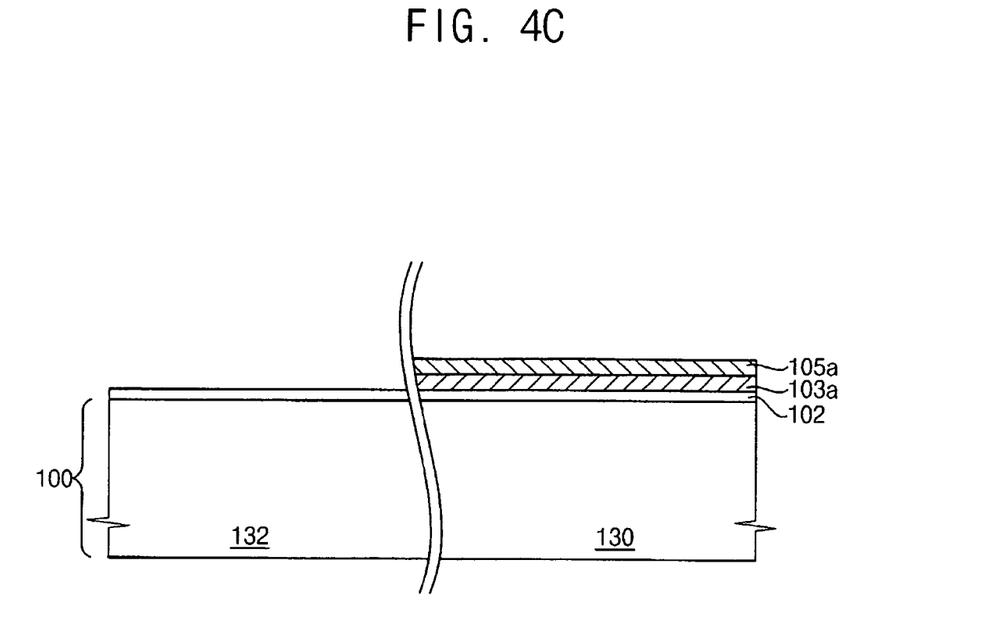

Referring to FIG. 4C, the photoresist layer pattern 108 is removed by ashing and stripping processes. Then, using the second metallic conductive layer portion 105a as an etching mask, the exposed first metallic conductive layer 103 is etched to leave a first metallic conductive layer portion 103a on the dielectric layer 102 of the first region 130 on which the PMOS transistor will be formed.

If the first metallic conductive layer 103 is dry-etched, the underlying dielectric layer 102 is damaged severely. Thus, it is desirable that the first metallic conductive layer 103 is etched by a wet etching process.

With respect to a standard cleaning-1 (SC-1) where ammonium hydroxide (NH$_4$OH), hydrogen peroxide (H$_2$O$_2$) and water (H$_2$O) are mixed with a ratio of 1:4:20, which is typically used at the wet etching of metals, the tantalum nitride is scarcely removed because of a low etch rate of about 1 Å/min, while the tungsten nitride has a high etch rate of about 1500 Å/min. The tungsten nitride also exhibits a high etch rate of about 50 Å/min with respect to a hydrogen peroxide solution where hydrogen peroxide (H$_2$O$_2$) and water (H$_2$O) are mixed with a ratio of about 1:5.

Accordingly, if the first metallic conductive layer 103 is formed of tungsten nitride having a high wet etch rate and the second metallic conductive layer 105 is formed of tantalum nitride having a high wet etch selectivity with respect to the tungsten nitride, the first metallic conductive layer 103 of the undesirable region, e.g., the second region 132 on which the NMOS transistor will be formed, can be easily removed using the second metallic conductive layer portion 105a as an etching mask.

Further, since the tantalum nitride of the second metallic conductive layer 105 has a high etch selectivity with respect to the tungsten nitride of the first metallic conductive layer 103 during a wet etching process with the SC-1 solution or the hydrogen peroxide solution, the second metallic conductive layer 105 including the tantalum nitride can serve as a suitable etching mask even though formed to a relatively thin thickness of less than about 1 Å.

According to this method embodiment, the wet etching process using the hydrogen peroxide solution is performed to slightly decrease the etch rate of the tungsten nitride, because the tungsten nitride has a very high etch rate to the SC-1 solution.

Figure 4D:
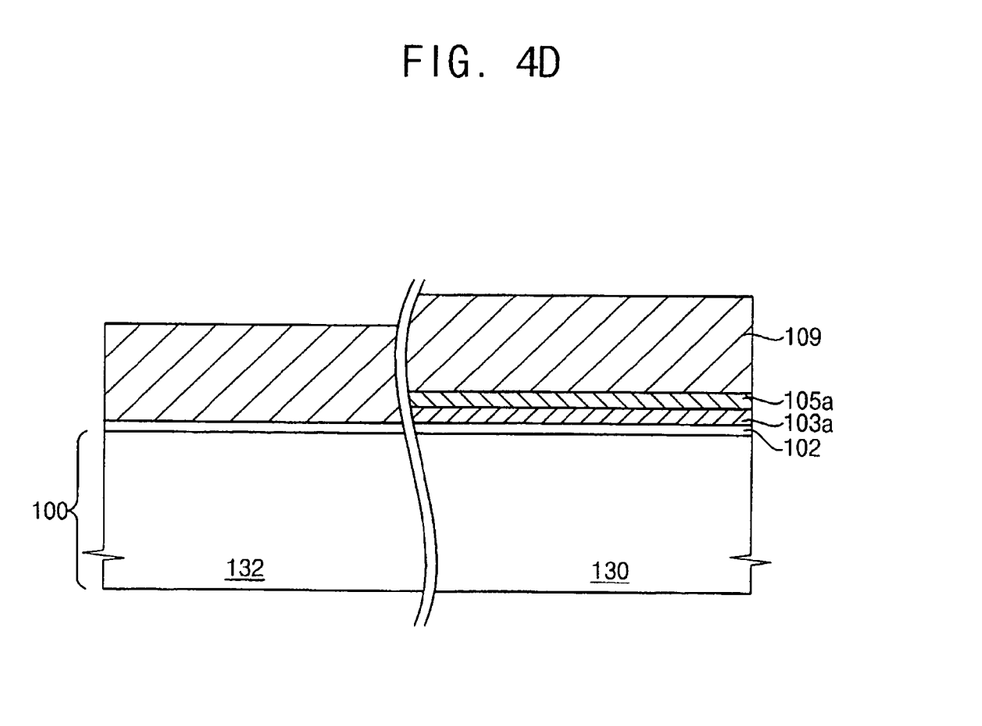

Referring to FIG. 4D, after leaving the first metallic conductive layer portion 103a only on the first region 130 by etching the first metallic conductive layer 103 as described above, a polysilicon layer 109 doped with N-type is deposited on the dielectric layer 102 of the second region 132 and on the second metallic conductive layer portion 105a.

The polysilicon layer 109 may be deposited by any suitable method known in the art, such as CVD or low pressure CVD (LPCVD). The polysilicon layer 109 may be deposited to a thickness of about 800~1000 Å.

Before depositing the polysilicon layer 109, a heat treatment process may be performed for curing the damage of the dielectric layer 102 caused by the wet etching process of the first metallic conductive layer 103. The heat treatment process may be carried out under an atmosphere including any one selected from the group consisting of N$_2$, NO, N$_2$O, O$_2$, NH$_3$ and H$_2$ or a combination thereof.

After depositing the polysilicon layer 109 as described above, a gate patterning is carried out with respect to the polysilicon layer 109, the second metallic conductive layer portion 105a and the first metallic conductive layer portion 103a by a lithography process.

As a result, a first gate electrode 120 of the PMOS transistor is on the first region 130 and a second gate electrode 125 of the NMOS transistor is on the second region 132 as shown in FIG. 2. The first gate electrode 120 includes a lower metallic conductive pattern 104 of the first metallic conductive layer, an upper metallic conductive pattern 106 of the second metallic conductive layer and a first polysilicon layer pattern 110a, which are successively stacked. The second gate electrode 125 includes a second polysilicon layer pattern 110b.

During the gate patterning process, the underlying dielectric layer is etched together to thereby form a first gate dielectric layer 102a of the PMOS transistor and a second gate dielectric layer 102b of the NMOS transistor.

According to the conventional method of manufacturing dual gates as shown in FIG. 1, the mask layer used for etching the metal gate layer should be removed, so that the underlying gate dielectric layer is removed together.

On the contrary, according to this present method embodiment of the present invention, it is unnecessary to remove the second metallic conductive layer 105 serving as an etching mask of the first metallic conductive layer 103, because the second metallic conductive layer 105 is formed of a conductive material, which does not adversely affect, or can increase, the work function of the first metallic conductive layer 103. Therefore, the process of removing the second metallic conductive layer 105 can be omitted to prevent the damage of the dielectric layer 102 and to simplify the fabrication process.

Further, since the second metallic conductive layer 105 has a high etch selectivity with respect to the first metallic conductive layer 103, the second metallic conductive layer 105 can serve as a suitable etching mask even though formed relatively thinly to a thickness of less than 100 Å. Accordingly, the height difference of the gate electrodes between the NMOS transistor region and the PMOS transistor region can be decreased so as to readily perform the etching process for gate patterning.

Meanwhile, according to this present method embodiment of the present invention, the first and second gate electrodes 120 and 125 may be formed substantially simultaneously.

However, the first and second gate electrodes 120 and 125 may be respectively formed by repeatedly performing a lithography process.

Embodiment 3

FIGS. 5A to 5D are cross-sectional views illustrating a method of manufacturing a semiconductor device in accordance with a third example embodiment of the present invention.

Figure 5A:
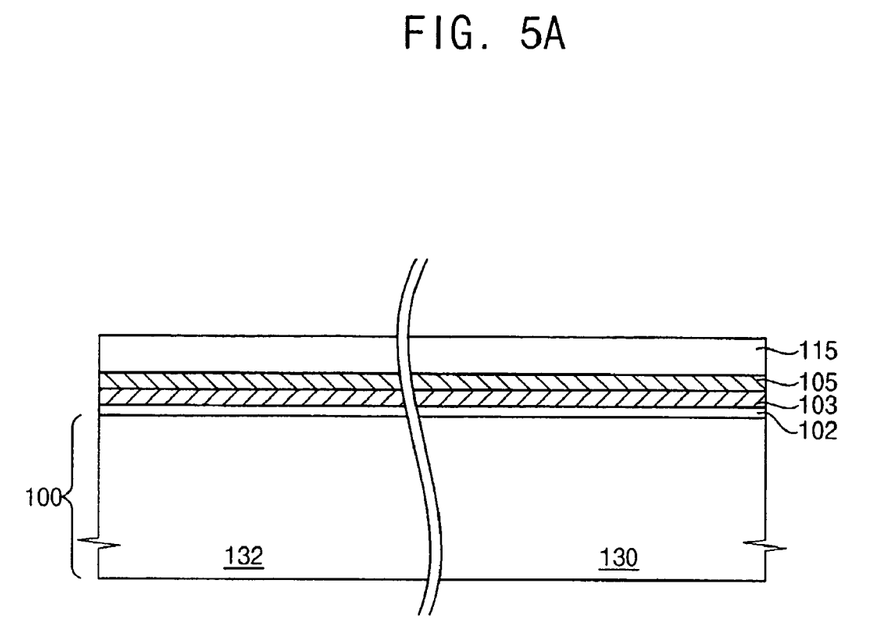
FIGS. 5A to 5D are cross-sectional views illustrating a method of manufacturing a semiconductor device with dual gates according to a third example embodiment of the present invention.

Referring to FIG. 5A, in the same manner as in the second embodiment of FIGS. 4A-4D, a dielectric layer 102, a first metallic conductive layer 103 and a second metallic conductive layer 105 are successively formed on a semiconductor substrate 100 having a first region 130 on which a PMOS transistor will be formed and a second region 132 on which an NMOS transistor will be formed.

The dielectric layer 102 is characterized by a high dielectric constant material. The dielectric layer 102 may be formed of any material known in the art, including $HfO_2$, $ZrO_2$, $TiO_2$, $Ta_2O_5$, $Nb_2O_5$, $Al_2O_3$, $Ce_2O_3$, $La_2O_3$, $Pr_2O_3$, $Dy_2O_3$, $Er_2O_3$, $Y_2O_3$, BST, ST, BT, PZT, SBT, and the like. The dielectric layer 102 may be formed of multiple materials, for example as a ternary structure or a laminate of multiple layers, including $ZrSiO_4$, ZrSiON, HfSiON, HfAlO, HfAlON, AlSiO, AlSiON, $BaSiO_4$, $PbSiO_4$, and the like. The dielectric layer 102 may be formed by any suitable methods known in the art, such as CVD, PECVD, HDP-CVD and ALD. In this embodiment, a high-k dielectric material is deposited to a thickness of less than about 50 Å by ALD, thereby forming the dielectric layer 102.

The first metallic conductive layer 103 is a layer that determines a work function of a gate electrode for the PMOS transistor. The first metallic conductive layer 103 may be formed from a conductive material such as WN. Alternatively, the first metallic conductive layer 103 may be formed from TaN, TiN, Ni, Pd, Pt, Be, Ir, Te, Re, Ru, Rh or the like. The first metallic conductive layer 103 may be deposited by any of the methods known in the art, such as CVD, PVD, ALD, ECD, MOCVD, PECVD and PEALD. In this embodiment, the first metallic conductive layer 103 is formed by depositing tungsten nitride (WN) to a thickness of about 50 Å using the CVD method.

The second metallic conductive layer 105 operates as an etching mask layer of the first metallic conductive layer 103. The second metallic conductive layer 105 may be formed of a conductive material, such as TaN, having an etch selectivity with respect to the first metallic conductive layer 103. Alternatively, the second metallic conductive layer 105 may be formed of WN, HfN, ZrN, TaSiN, TiSiN, NiSiN, Pb, Pt, Be, Ir, Te, Re, Ru, Rh, Al, Ag, Bi, Cd, Fe, Ta, Ga, Hf, In, Mn, Nb, Y, Zr, or the like.

Further, the material constituting the second metallic conductive layer 105 does not adversely affect the work function of the first metallic conductive layer 103 or can increase the work function. The second metallic conductive layer 105 may be deposited by any methods known in the art, such as CVD, PVD, ALD, ECD, MOCVD, PECVD and PEALD. In this embodiment, the second metallic conductive layer 105 is formed by depositing tantalum nitride (TaN) to a thickness of less than 50 Å using the PVD method.

Then, silicon oxide is deposited to a thickness of about 200 Å on the second metallic conductive layer 105, thereby forming a hard mask layer 115. The hard mask layer 115 is formed by an ALD method so that the silicon oxide is deposited at a low temperature and exhibits a high wet etch rate.

Figure 5B:
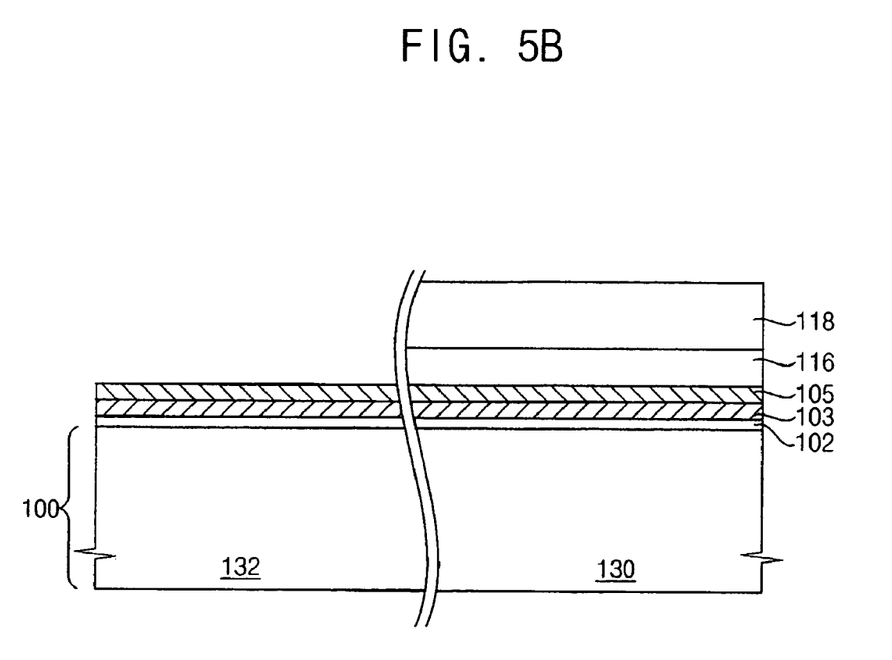

Referring to FIG. 5B, after coating a photoresist layer on the hard mask layer 115, the photoresist layer is exposed and developed to form a photoresist layer pattern 118 opening the second region 132 on which the NMOS transistor will be formed.

Then, using the photoresist layer pattern 118 as an etching mask, the exposed hard mask layer 115 is etched to form a hard mask layer pattern 116 on the second metallic conductive layer 105 of the first region 130 on which the PMOS transistor will be formed.

In case that the hard mask layer 115 is formed of the ALD oxide, the hard mask layer 115 may be etched by a wet etching process with 200:1 diluted hydrofluoric acid (HF), because the ALD oxide has a high wet etch rate with respect to the diluted hydrofluoric acid (HF).

Figure 5C:
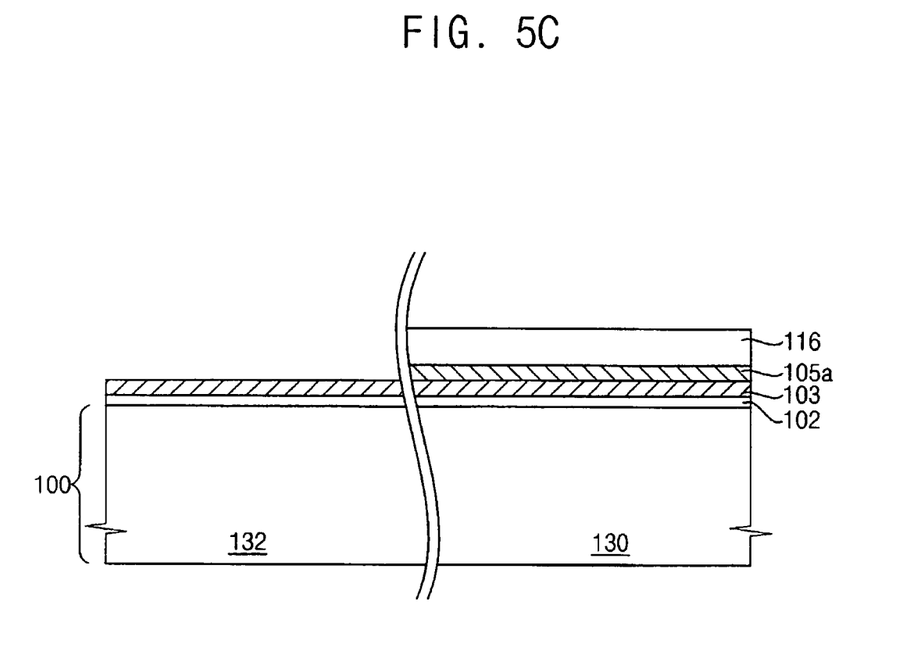

Referring to FIG. 5C, the photoresist layer pattern 118 is removed by ashing and stripping processes. Then, the exposed second metallic conductive layer 105 is etched by a dry etching process using the hard mask layer pattern 116 as an etching mask, thereby leaving a second metallic conductive layer portion 105a on the first metallic conductive layer 103 of the first region 130 on which the PMOS transistor will be formed.

In the second embodiment described above, the second metallic conductive layer 105 is etched using the photoresist layer pattern so that the etch by-products such as polymer may be formed on sidewalls of the second metallic conductive layer portion 105a. Accordingly, this problem of polymer formation can be prevented by etching the second metallic conductive layer 105 using the hard mask layer pattern 116 including the silicon oxide.

Figure 5D:
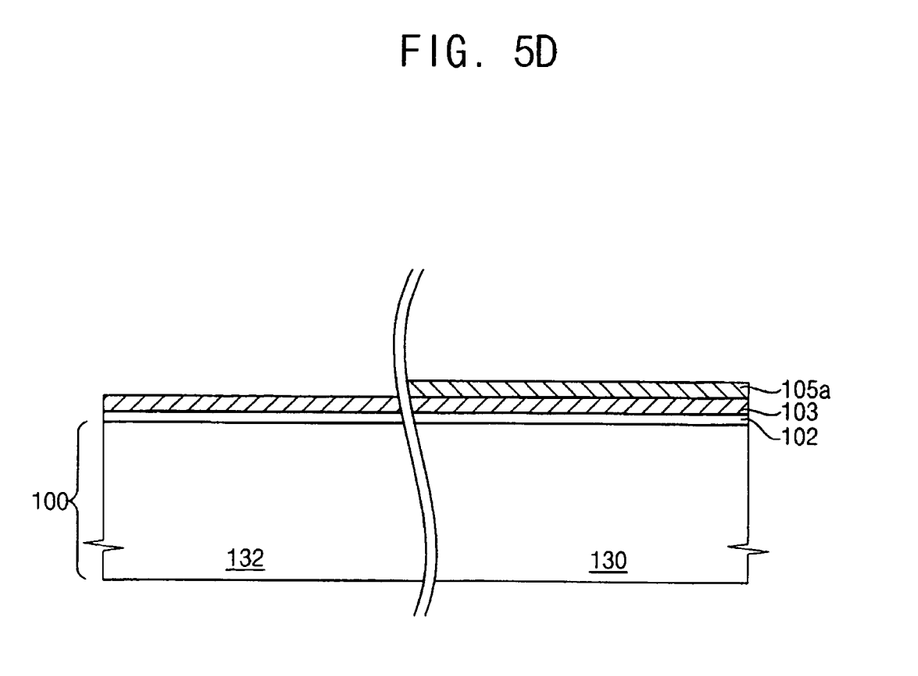

Referring to FIG. 5D, the hard mask layer pattern 116 is removed by an overall etch-back process. Then, the exposed first metallic conductive layer 103 is etched by a wet etching process using the second metallic conductive layer portion 105a as an etching mask, thereby leaving a first metallic conductive layer portion 103a on the dielectric layer 102 of the first region 130 on which the PMOS transistor will be formed.

The tantalum nitride exhibits a high etch selectivity with respect to the tungsten nitride during a wet etching process with SC-1 solution or hydrogen peroxide solution. In this embodiment, the first metallic conductive layer 103 is etched by a wet etching process using the hydrogen peroxide solution, because the tungsten nitride has a very high etch rate to the SC-1 solution.

After leaving the first metallic conductive layer portion 103a only on the first region 130 as described above, a polysilicon layer doped with N-type is deposited on the dielectric layer 102 of the second region 132 and on the second metallic conductive layer portion 105a.

The polysilicon layer may be deposited by any suitable methods known in the art, such as CVD and LPCVD. The polysilicon layer is deposited to a thickness of about 800~1000 Å.

A heat treatment process may be performed for curing the damage of the dielectric layer 102 caused by the wet etching process of the first metallic conductive layer 103, if necessary, before depositing the polysilicon layer. The heat treatment process may be carried out under an atmosphere including any one selected from the group consisting of $N_2$, NO, $N_2O$, $O_2$, $NH_3$ and $H_2$ or a combination thereof.

Then, a gate patterning is carried out with respect to the polysilicon layer, the second metallic conductive layer portion 105a and the first metallic conductive layer portion 103a by a lithography process, thereby forming a first gate electrode 120 of the PMOS transistor on the first region 130 and a second gate electrode 125 of the NMOS transistor on the second region 132, as shown in FIG. 2. The first gate electrode 120 includes a lower metallic conductive pattern 104, an upper metallic conductive pattern 106 and a first polysilicon layer pattern 110a, which are successively stacked. The second gate electrode 125 includes a second polysilicon layer pattern 110b.

During the gate patterning process, the underlying dielectric layer is etched together to thereby form a first gate dielectric layer 102a of the PMOS transistor and a second gate dielectric layer 102b of the NMOS transistor.

According to the example embodiments of the present invention as described above, the first gate electrode of stacked structure including the lower metallic conductive pattern, the upper metallic conductive pattern and the first polysilicon layer pattern is formed on the PMOS transistor region, while the second gate electrode of single layer structure including the second polysilicon layer pattern is formed on the NMOS transistor region. As a result, a semiconductor device with dual gate electrodes, that is two different types of gate electrode structures, can be realized.

The lower metallic conductive pattern determines the work function of the first gate electrode and the upper metallic conductive pattern serves as an etching mask of the lower metallic conductive pattern.

Since the upper metallic conductive pattern is formed from a conductive material which does not adversely affect the work function of the lower metallic conductive pattern, or can increase the work function, a process of removing the upper metallic conductive pattern can be omitted to prevent the gate dielectric layer from being damaged, and to simplify the processes.

Further, since the upper metallic conductive pattern having a high etch selectivity with respect to the lower metallic conductive pattern can be formed relatively thinly, the height difference of the gate electrodes between the NMOS transistor region and the PMOS transistor region can be decreased to thereby readily perform the etching process for gate patterning.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A method of manufacturing a semiconductor device with dual gates, comprising:
providing a semiconductor substrate having a first region on which a MOS transistor of a first conductivity type will be formed and a second region on which a MOS transistor of a second conductivity type will be formed;
forming a dielectric layer, a first metallic conductive layer and a second metallic conductive layer on the first and second regions;
etching the second metallic conductive layer formed on the first metallic conductive layer of the second region, thereby a metal pattern is formed on the first metallic conductive layer of the first region;
etching the first metallic conductive layer formed on the dielectric layer of second region using the metal pattern as an etching mask;
forming a polysilicon layer on the dielectric layer of the second region and the metal pattern of the first region;
forming a first gate electrode by etching portions of the polysilicon layer, the metal pattern, and the first metallic conductive layer of the first region, the first gate electrode including a lower metallic conductive pattern, an upper metallic conductive pattern, and a polysilicon pattern; and
forming a second gate electrode by etching portions of the polysilicon layer formed directly on the dielectric layer of the second region.

2. The method of claim 1, wherein the first metallic conductive layer comprises a metal containing conductive material having a work function suitable to the MOS transistor of the first conductivity type.

3. The method of claim 1, wherein the first metallic conductive layer comprises any material selected from the group consisting of WN, TaN, TiN, Ni, Pd, Pt, Be, Ir, Te, Re, Ru and Rh.

4. The method of claim 1, wherein the second metallic conductive layer comprises a metal containing conductive material having an etch selectivity with respect to the first metallic conductive layer.

5. The method of claim 1, wherein the second metallic conductive layer comprises any material selected from the group consisting of TaN, WN, HfN, ZrN, TaSiN, TiSiN, NiSiN, Pd, Pt, Be, Ir, Te, Re, Ru, Rh, Al, Ag, Bi, Cd, Fe, Ta, Ga, Hf, In, Mn, Nb, Y and Zr.

6. The method of claim 1, wherein the second metallic conductive layer has a thickness of less than about 100 Å.

7. The method of claim 1, wherein etching the second metallic conductive layer formed on the first metallic conductive layer of the second region comprises:
forming a photoresist layer pattern on the second metallic conductive layer of the first region;
removing the second metallic conductive layer of the second region using the photoresist layer pattern as an etching mask; and
removing the photoresist layer pattern.

8. The method of claim 1, wherein etching the second metallic conductive layer formed on the first metallic conductive layer of the second region comprises:
forming a hard mask layer on the second metallic conductive layer;
patterning the hard mask layer using a photoresist pattern as an etching mask to form a hard mask layer pattern on the second metallic conductive layer of the first region;
removing the photoresist pattern;
etching the second metallic conductive layer of the second region using the hard mask layer pattern as an etching mask; and
removing the hard mask layer pattern.

9. The method of claim 1, wherein etching the first metallic conductive layer formed on the dielectric layer of second region using the metal pattern as an etching mask is performed by a wet etching process.

10. The method of claim 1, wherein the dielectric layer comprises a high-k dielectric.

11. The method of claim 1, prior to forming the polysilicon layer, further comprising performing a heat treatment process for curing a damage of the dielectric layer caused by etching the first metallic conductive layer of the second region.

12. The method of claim 11, wherein the heat treatment process is performed under an atmosphere including any one selected from the group consisting of $N_2$, NO, $N_2O$, $O_2$, $NH_3$ and $H_2$ or a combination thereof.

13. The method of claim 1, wherein the first conductivity type is P-type and the second conductivity type is N-type.

14. The method of claim 1, wherein the first and second gate electrodes are formed substantially simultaneously.

15. The method of claim 1, wherein the second gate electrode includes a polysilicon pattern etched from the polysilicon layer formed directly on the dielectric layer of the second region.

* * * * *